(12) United States Patent
Byun et al.

(10) Patent No.: US 6,736,306 B2
(45) Date of Patent: May 18, 2004

(54) SEMICONDUCTOR CHIP PACKAGE COMPRISING ENHANCED PADS

(75) Inventors: Hyung-Jik Byun, Chungcheongnam-do (KR); Kyu-Jin Lee, Chungcheongnam-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/053,278

(22) Filed: Jan. 16, 2002

(65) Prior Publication Data

US 2002/0104874 A1 Aug. 8, 2002

(30) Foreign Application Priority Data

Feb. 5, 2001 (KR) .......................................... 2001-5383

(51) Int. Cl.[7] .................. B23K 31/02; H01L 23/48; H01L 29/40
(52) U.S. Cl. .................. 228/180.22; 228/215; 228/246; 228/248.1; 257/738; 257/773; 257/779; 361/777; 438/129; 438/613
(58) Field of Search .............................. 228/180.22, 214, 228/215, 248.1, 248.5, 245, 246, 41; 257/734, 737, 738, 773, 775, 777, 778, 779, 784, 786; 438/128, 129, 130, 612, 613, 614; 361/767, 772, 773, 774, 777, 808

(56) References Cited

U.S. PATENT DOCUMENTS

| | | | | |
|---|---|---|---|---|
| 6,010,058 A | * | 1/2000 | Kim et al. | 228/103 |
| 6,144,102 A | * | 11/2000 | Amagai | 257/781 |
| 6,242,815 B1 | * | 6/2001 | Hsu et al. | 257/786 |
| 6,303,878 B1 | * | 10/2001 | Kondo et al. | 174/261 |
| 6,307,271 B1 | * | 10/2001 | Nakamura | 257/786 |
| 6,492,714 B1 | * | 12/2002 | Kasatani | 257/678 |
| 6,548,765 B2 | * | 4/2003 | Kondo et al. | 174/260 |
| 6,564,986 B1 | * | 5/2003 | Hsieh | 228/103 |
| 2002/0104874 A1 | * | 8/2002 | Byun et al. | |

FOREIGN PATENT DOCUMENTS

| | | |
|---|---|---|
| JP | 06-037143 | 10/1994 |
| JP | 09-237802 | 9/1997 |
| JP | 10-284500 | 10/1998 |
| JP | 11-074637 | 3/1999 |
| JP | 2000-243862 | 8/2000 |
| KR | 1999-006104 | 2/1999 |

OTHER PUBLICATIONS

English Translation of abstract for Japanese Patent Publication No. 2000–243862.
English language abstract for Korea Patent Publication No. Utility Model 1999–006104.
English language abstract for Japanese Patent Publication No. 09–237802.
English language abstract for Japanese Patent Publication No. 06–037143.
English language abstract for Japanese Patent Publication No. 11–074637.
English language abstract for Japanese Patent Publication No. 10–284500.

* cited by examiner

*Primary Examiner*—Kiley Stoner
(74) *Attorney, Agent, or Firm*—Marger Johnson & McCollom, P.C.

(57) ABSTRACT

A semiconductor chip package includes a semiconductor chip mounted on a top surface of a substrate. A bottom surface of the substrate has ball pads. Bonding pads of the chip are electrically connected to the substrate. Enhanced pads, each having one or more dummy patterns coupled to one or more dummy pads, are preferably formed near edges of the substrate. The semiconductor chip package is mounted on the board by attaching external connection terminals such as solder balls, formed on the ball pads and the dummy pads, to a solder paste coated on ball lands and enhanced lands of the board.

26 Claims, 7 Drawing Sheets

SEMICONDUCTOR CHIP PACKAGE COMPRISING ENHANCED PADS

This application claims priority from Korean Patent Application 2001-5385, filed Feb. 5, 2001, the contents of which are incorporated herein by reference in their entirety.

BACKGROUND OF THE INVENTION

1. Field of the Invention

The present invention relates to semiconductor packaging techniques and, more particularly, to a semiconductor chip package and a method of manufacturing the same.

2. Description of the Related Art

The trend in the electronics industry is toward producing lighter, thinner, faster, and more reliable multi-functional, high quality devices. A ball grid array (BGA) package has been introduced as one way of meeting these demands.

There are several ways to mount a BGA package on a board. When connection terminals such as solder balls are used, poor adhesion between the semiconductor chip package and the board has been a problem. Improvement in the reliability of these solder joints between the semiconductor chip package and the board is therefore desired.

Several methods have been proposed as ways to improve the reliability of solder joints. In one method, dummy balls are formed along the exterior of the solder balls. In another approach, the size of solder balls or the shape of photo solder resist (PSR) is controlled. And in another method, the material of solder balls is changed. Yet another method is used in a conventional BGA package, as described below.

FIG. 1 is a cross-sectional view of a conventional BGA package 100. FIG. 2 is a plan view of the bottom surface of a substrate 20 of the conventional BGA package 100 of FIG. 1. FIG. 3 is an enlarged cross-sectional view of an area "A" of the BGA package 100 of FIG. 1. Referring to FIGS. 1 through 3, in the conventional BGA package 100, a semiconductor chip 10 is mounted on the top surface of the substrate 20. Bonding pads 12 of the semiconductor chip 10 are connected to metal wirings (not shown) of the substrate 20 via connectors 30 such as bonding wires. The semiconductor chip 10 and the electrical connection parts including the connectors 30 are encapsulated with a molding resin such as an epoxy molding compound (EMC), thereby forming a package body 40. Ball pads 24 are formed on the bottom surface of the substrate 20 and correspond to the metal wirings (not shown) of the substrate 20. The ball pads 24 are exposed from a photo solder resist (PSR) layer 22. A connection terminal 60 such as a solder ball is formed on each ball pad 24. The above-described package 100 is mounted on a board 50. The board 50 comprises ball lands 54 corresponding to the ball pads 24 and the connection terminals 60.

As shown in FIG. 3, the ball pads 24 of the package 100 are electrically connected to the ball lands 54 of the board 50 via the connection terminals 60. The connections of the connection terminals 60 to the ball pads 24 or to the ball lands 54 significantly affect the reliability of the package mounting. Since the above-described conventional BGA package 100 is mounted on the board by adhering the solder balls therebetween, the reliability of the package mounting is directly affected by the reliability of the solder joint of the connection terminals to the ball pads or to the ball lands.

As the size of the solder ball has become drastically reduced, the mounting height of the package on the board has also been reduced. This can result in cracks in the joints between the package and the board. In particular, among a group of solder balls arranged in a lattice shape, cracks occur more easily on the outermost solder balls. Furthermore, cracks occur most frequently along the long sides. Most of these cracks are caused by differences in the coefficients of thermal expansion.

Specifically, there is often a difference in the coefficients of thermal expansion between the solder balls and the ball pads or between the solder balls and the ball lands. Therefore, when the semiconductor chip package is tested under a temperature cycling (T/C) test, cracks occur in the joints between the solder balls and the ball pads or in the joints between the solder balls and the ball lands. Because cracks occur mainly in the joints between the solder balls and the substrate of the package, the industry would be greatly benefited by a method and structure that provides an improved joint force between the outermost solder balls and the ball pads of the substrate.

SUMMARY OF THE INVENTION

Accordingly, the present invention provides a semiconductor chip package configured to prevent cracks from forming between external connection terminals such as solder balls and ball pads.

Also, the present invention improves the solder joint reliability of a semiconductor chip package on a board by reducing the likelihood that its outermost solder balls will be damaged.

Accordingly, a substrate for forming a ball grid array (BGA) package comprises: a substrate having a top surface and a bottom surface having ball pads, and a plurality of enhanced pads formed on the bottom surface of the substrate. Each of the enhanced pads includes one or more dummy pads coupled to one or more dummy patterns.

According to another embodiment of the present invention, a semiconductor chip package comprises a substrate having a top surface for mounting a semiconductor chip thereon and a bottom surface having ball pads. A plurality of enhanced pads are formed on the bottom surface of the substrate. Each of the enhanced pads includes one or more dummy pads coupled to one or more dummy patterns. External connection terminals such as solder balls are formed on the ball pads. A molding resin encapsulates the semiconductor chip.

The ball pads are preferably arranged in a lattice shape on the bottom surface of the substrate. The enhanced pads are formed on outer edges of the ball pad lattice. The enhanced pads preferably comprise first, second, and third enhanced pads. Each of the first enhanced pads may comprise one ball pad, two dummy pads, and dummy patterns for connecting the ball pad to the dummy pads. Each of the second enhanced pads may comprise one ball pad, one dummy pad, and a dummy pattern for connecting the ball pad to the dummy pad. Each of the third enhanced pads may comprise two dummy pads and a dummy pattern for connecting the dummy pads to each other.

BRIEF DESCRIPTION OF THE DRAWINGS

The foregoing and other objects, features and advantages of the present invention will be more readily understood through the following detailed description of preferred embodiments made with reference to the accompanying drawings, wherein like reference numerals designate like structural elements, and, in which.

DETAILED DESCRIPTION OF PREFERRED EMBODIMENTS

Figure 4:
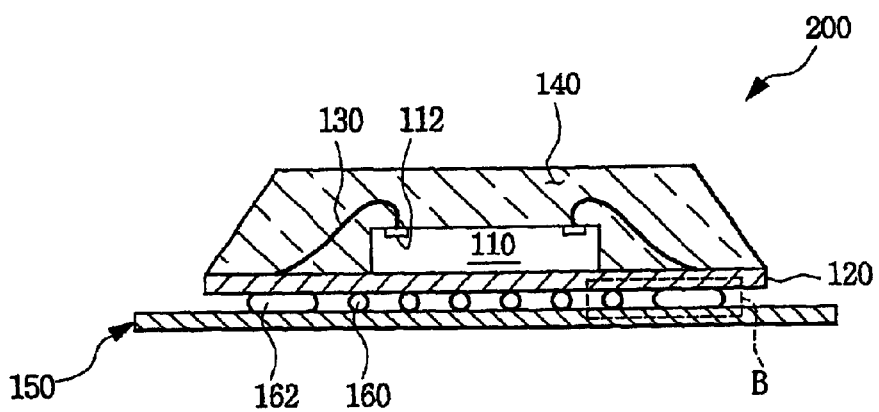
FIG. 4 is a cross-sectional view of a BGA package mounted on a board in accordance with an embodiment of the present invention.
Figure 5:
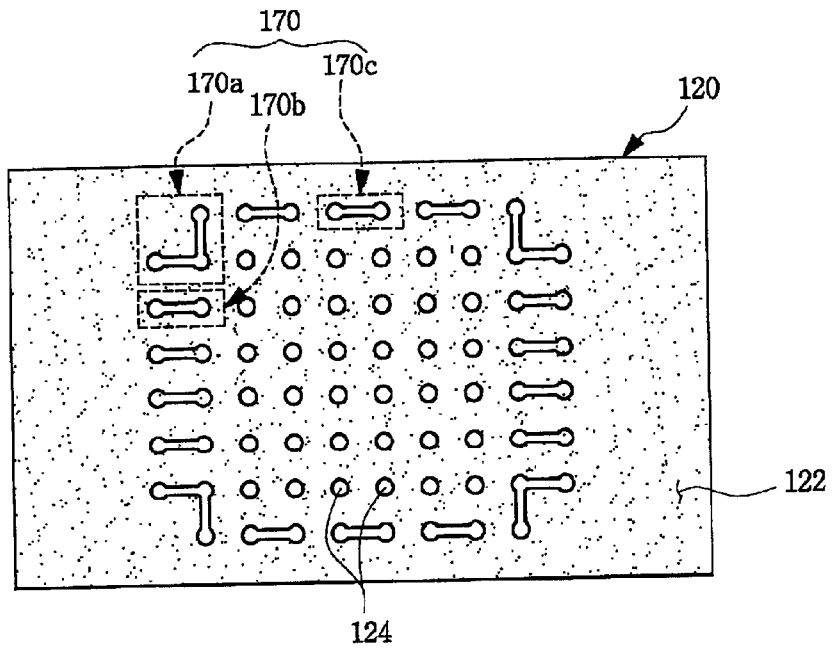
FIG. 5 is a plan view of the bottom surface of the board-mounted BGA package of FIG. 4.
Figure 6:
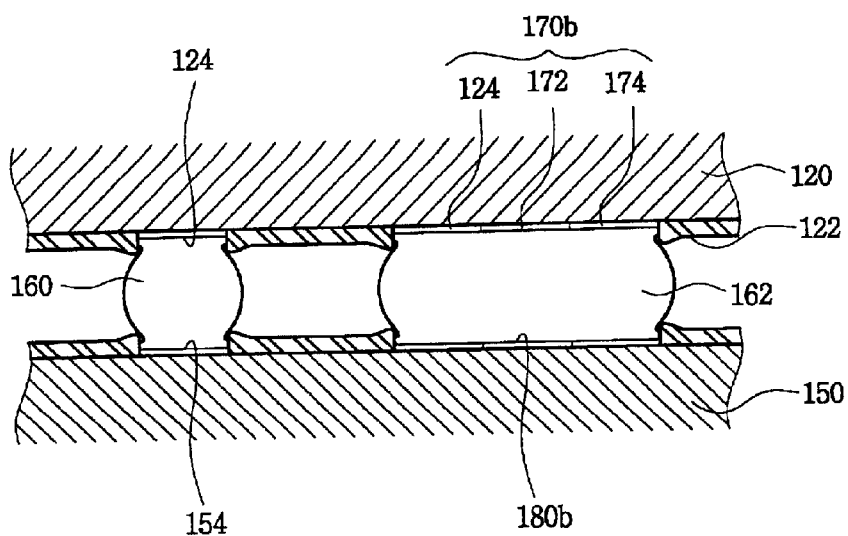
FIG. 6 is an enlarged cross-sectional view of an area "B" of the board of the board-mounted BGA package of FIG. 4.

Preferred embodiments of the present invention will be described below with reference to the accompanying drawings. In particular, a board-mounted BGA package 200 according to an embodiment of the invention will be described in detail below with reference to FIGS. 4 through 6. FIG. 4 is a cross-sectional view of the board-mounted BGA package 200, including a chip 110 mounted on a substrate 120. FIG. 5 is a plan view of the bottom surface of the substrate 120 shown in FIG. 4. FIG. 6 is an enlarged cross-sectional view of an area "B" of FIG. 4 showing an interconnection between a board 150 and the BGA package 200.

Referring to FIGS. 4 through 6, in the BGA package 200, the semiconductor chip 110 is mounted on the top surface of the substrate 120. Bonding pads 112 of the chip 110 are connected to metal wirings (not shown) of the substrate 120 via electrical connectors 130, such as bonding wires. The semiconductor chip 110 and the electrical connectors 130 are encapsulated with a molding resin such as an epoxy molding compound (EMC), thereby forming a package body 140. Ball pads 124 are formed on the bottom surface of the substrate 120 and correspond to the metal wirings of the substrate 120. The ball pads 124 are exposed from, for example, a photo solder resist (PSR) layer 122. An external connection terminal 160 such as a solder ball is formed on each ball pad 124.

Enhanced pads 170 (including first, second, and third enhanced pads 170a, 170b, 170c) are preferably formed at outer edges of the bottom surface of the substrate 120. Each of the enhanced pads 170 comprises one ball pad 124, at least one dummy pad 174, and dummy patterns 172. The dummy patterns connect the ball pad 124 to the dummy pad 174. The detailed structure of the enhanced pads 170 will now be further described.

Figure 1:
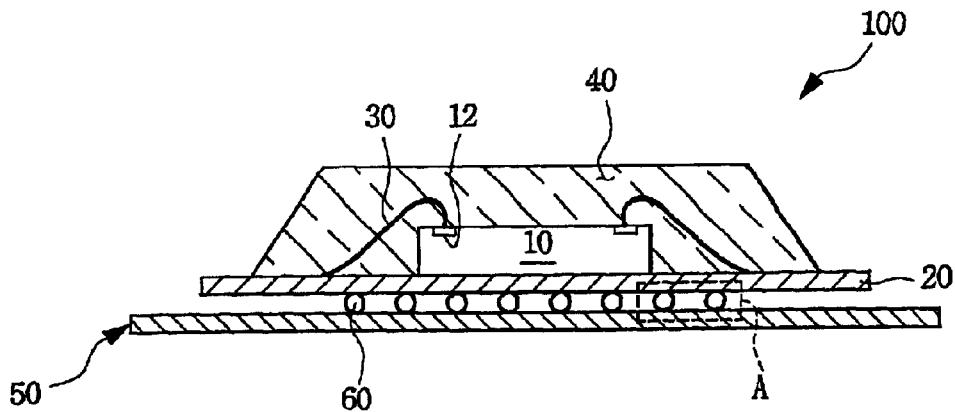
FIG. 1 is a cross-sectional view of a conventional BGA package mounted on a board.
Figure 2:
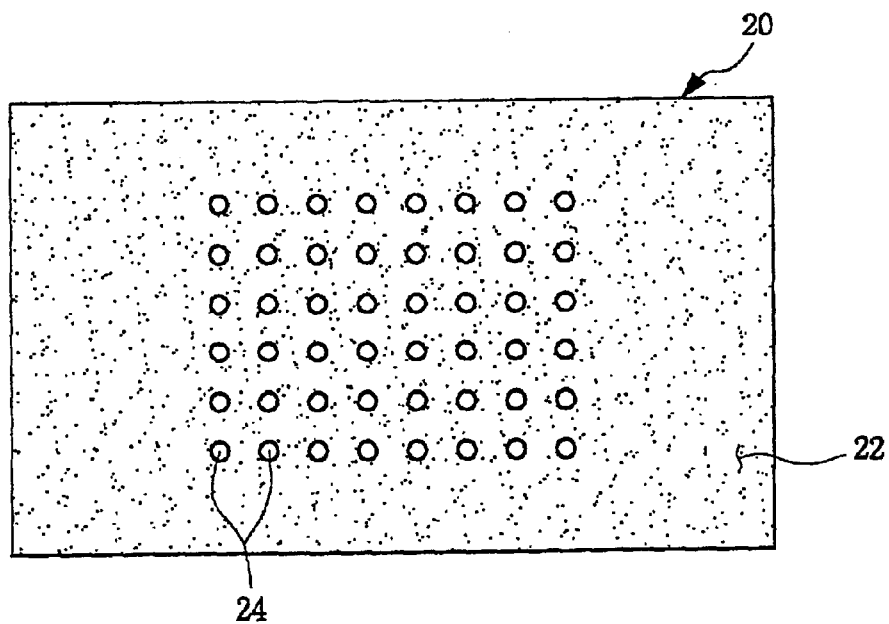
FIG. 2 is a plan view of the bottom surface of the board of the conventional board-mounted BGA package of FIG. 1.
Figure 3:
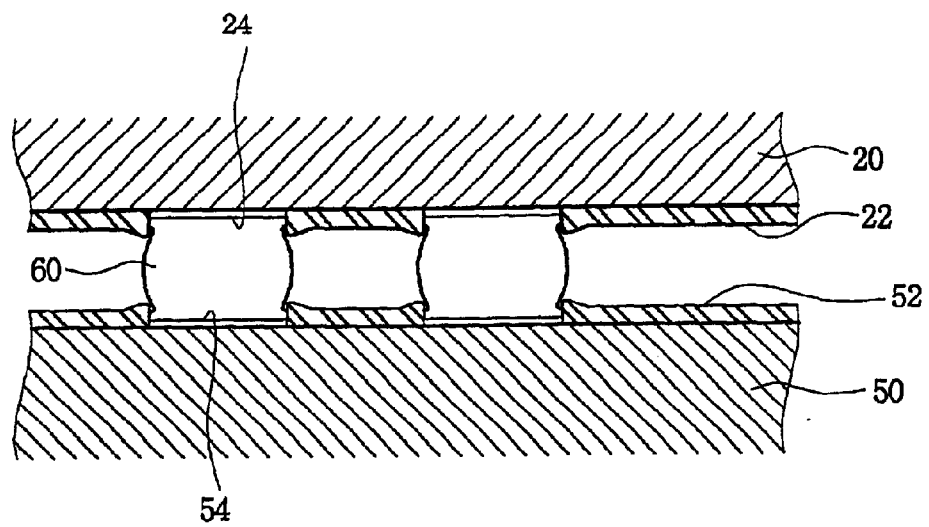
FIG. 3 is an enlarged cross-sectional view of an area "A" of the conventional board-mounted BGA package of FIG. 1.

The BGA package 200 is mounted on the board 150. The board 150 comprises ball lands 154 and enhanced lands 180, corresponding to the ball pads 124 and the enhanced pads 170. As shown in FIG. 6, the ball pads 124 and the enhanced pads 170b of the BGA package 200 are electrically connected to the ball lands 154 and the enhanced lands 180b of the board 150 through the connection terminals 160, 162. The connection terminals 162 between the enhanced pads 170b and the enhanced lands 180b improve the reliability of the package mounting of this BGA package 200 over that of the conventional BGA package 100 (see FIGS. 1 through 3).

Still referring to FIG. 6, the connection terminals 162 are uniformly attached along substantially the entire surface area of the enhanced pads 170 and the enhanced lands 180. Although conventional dummy balls have been formed on dummy pads, since the dummy ball has the same size as the solder ball, this merely increases the size of the joint area or the package substrate without substantially increasing solder joint reliability. In the present embodiment, each of the connection terminals 162 has at least two pads, i.e., the bond pad 124 and the dummy pad as well as patterns for connecting the pads to each other. The connection terminal 162 is therefore larger than the conventional structure, thereby improving the joint force. The connection terminals 162 between the enhanced pads 170 and the enhanced lands 180 thereby improves the solder joint reliability of the surface mount package over the prior art.

As shown in FIG. 5, the enhanced pads 170 and the connection terminals 162 corresponding to the enhanced pads 170 are formed along the outer edges of the substrate 120. Compared to solder balls nearer the center of the substrate, cracks occur more easily in the outermost solder balls. By arranging the enhanced pads along the outer edges, the solder joint reliability of the package is thereby improved. In other words, the enhanced pads formed along the outer edges of the substrate help prevent the occurrence of cracks of those solder balls. The solder balls are preferably all approximately the same size.

Figure 7A:
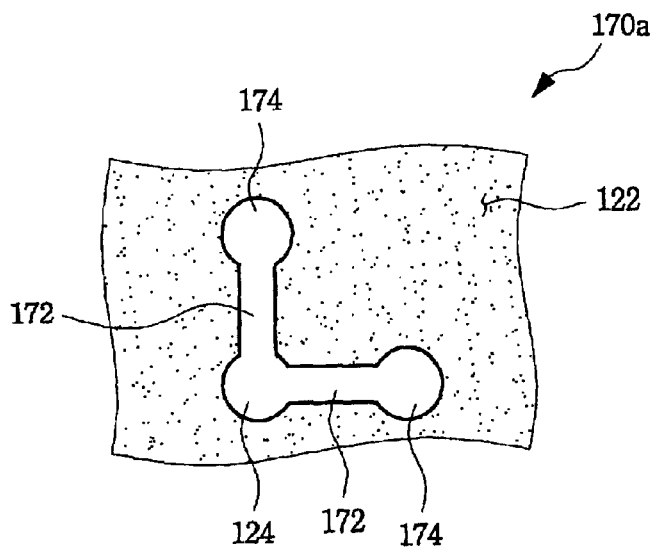
FIGS. 7a to 7c are plan views illustrating several examples of enhanced pads of the present invention.
Figure 7B:
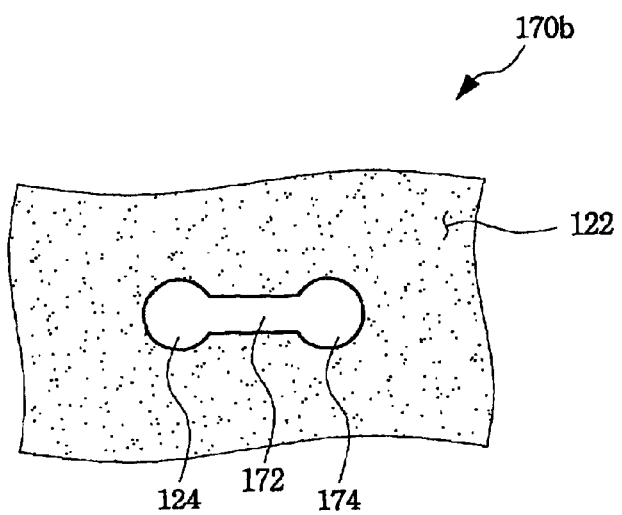
Figure 7C:
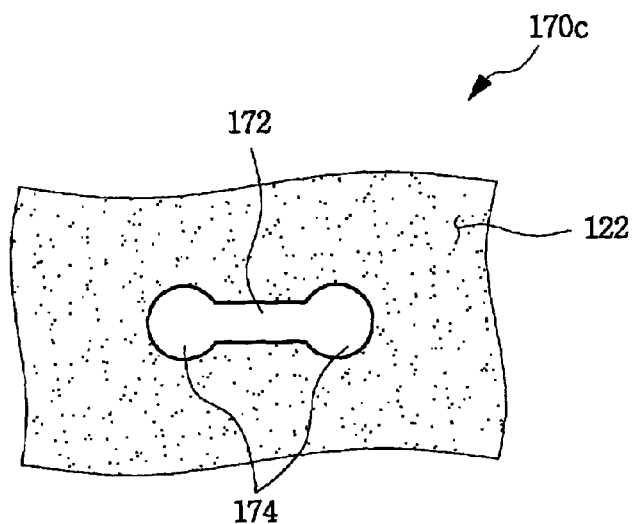

FIGS. 7a through 7c are plan views showing the various configurations of the enhanced pads 170 of this embodiment. Each of these enhanced pads 170 comprises at least one dummy pad and a dummy pattern. Referring to FIGS. 5 and 7a, a first enhanced pad 170a comprises one ball pad 124, two dummy pads 174 arranged adjacent to the ball pad 124, and dummy patterns 172. The dummy patterns 172 connect the dummy pads 174 to the ball pad 124 and are preferably arranged perpendicular to each other. The first enhanced pads 170a are arranged in the corners of the substrate 120.

Referring to FIGS. 5 and 7b, a second enhanced pad 170b comprises a ball pad 124, a dummy pad 174 arranged adjacent to the ball pad 124, and a dummy pattern 172 that connects the dummy pad 174 to the ball pad 124. The second enhanced pads 170b are arranged along the short sides of the substrate 120. More particularly, each of the ball pads 124 located near a short side of the substrate 120 is connected to a single dummy pad 174 by the dummy pattern 172 to form a second enhanced pad 170b.

Referring to FIGS. 5 and 7c, a third enhanced pad 170c comprises a dummy pattern 172 connecting two dummy pads 174 to each other. The third enhanced pads 170c are arranged along long sides of the substrate. In other words, dummy pad pairs formed on long sides of the substrate 120 are connected together by a dummy pattern 172 to form the third enhanced pads 170c.

As described above, most of the dummy patterns 172 of this embodiment are arranged parallel to the long sides of the substrate 120. Since cracks, due to differences in the coefficients of thermal expansion between the substrate and the solder balls, occur most frequently along the long sides of the substrate 120, this configuration effectively prevent those cracks from forming. It should also be noted that enhanced lands 180 and ball lands 154 are formed on the board 150 to correspond to each of the enhanced pads 170. Since the enhanced lands 180 have the same configuration as the enhanced pads 170, the detailed description thereof will be omitted.

FIGS. 8a to 8d are flow charts illustrating a method of mounting a BGA package on a board 150 using the enhanced pads 170 of the foregoing embodiment of the present invention. The following method will be described with respect to the second enhanced pads 170b (of FIG. 7b). It should be noted, however, that the same method is also applicable to the first enhanced pads 170a as well as the third enhanced pads 170c.

Figure 8A:
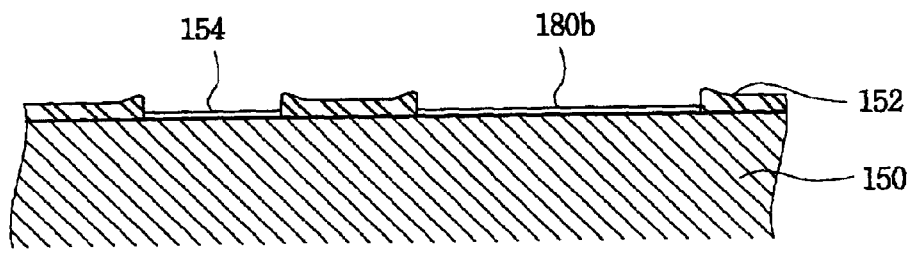
FIGS. 8a to 8d are flow charts illustrating a method of mounting a BGA package on a board using the enhanced pads of the present invention.
Figure 8B:
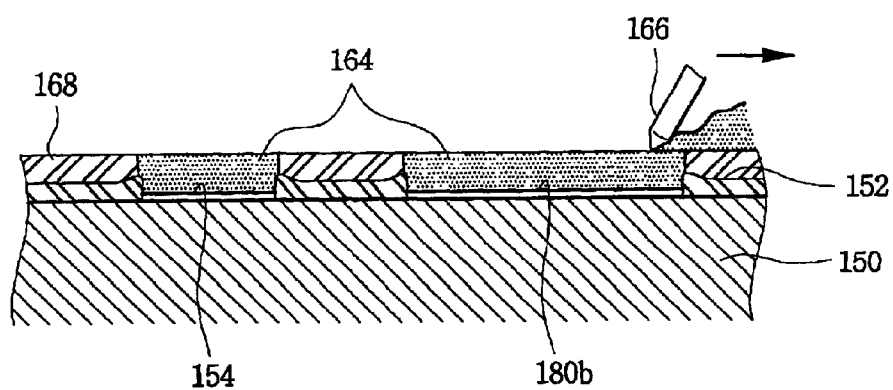

Referring to FIG. 8a, the board 150 is prepared. To prepare the board 150, the ball lands 154 and the enhanced lands 180b are exposed from a photo solder resist (PSR) layer 152. Referring to FIG. 8b, a mask 168 having openings corresponding to the ball lands 154 and the enhanced lands 180b is mounted on the board 150. A solder paste 168 is then provided on the ball lands 154 and the enhanced lands 180b with a squeegee 166. The mask 168 is then removed.

Figure 8C:
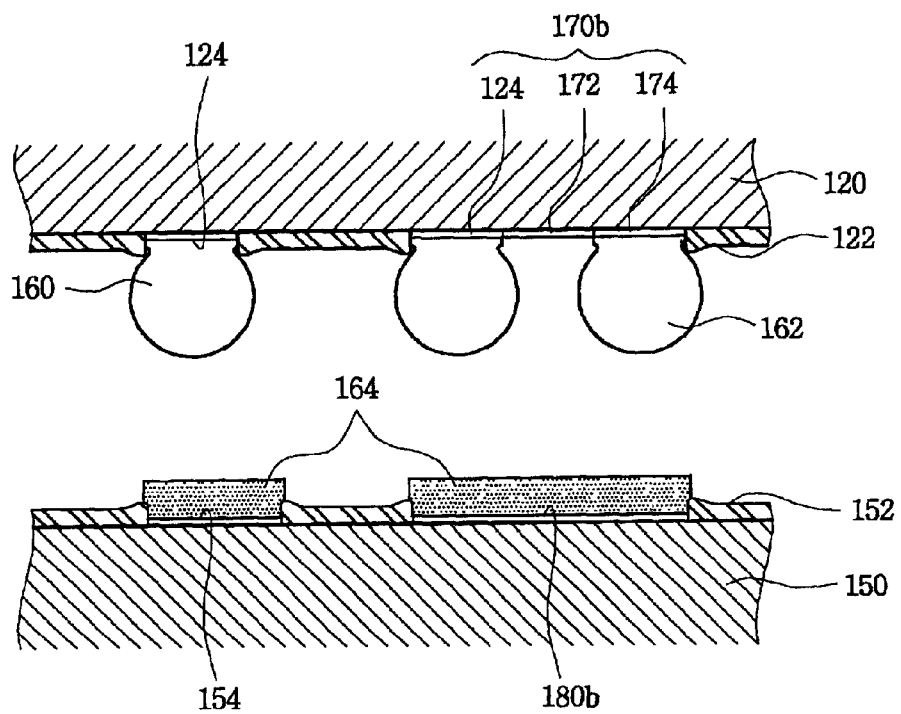
Figure 8D:
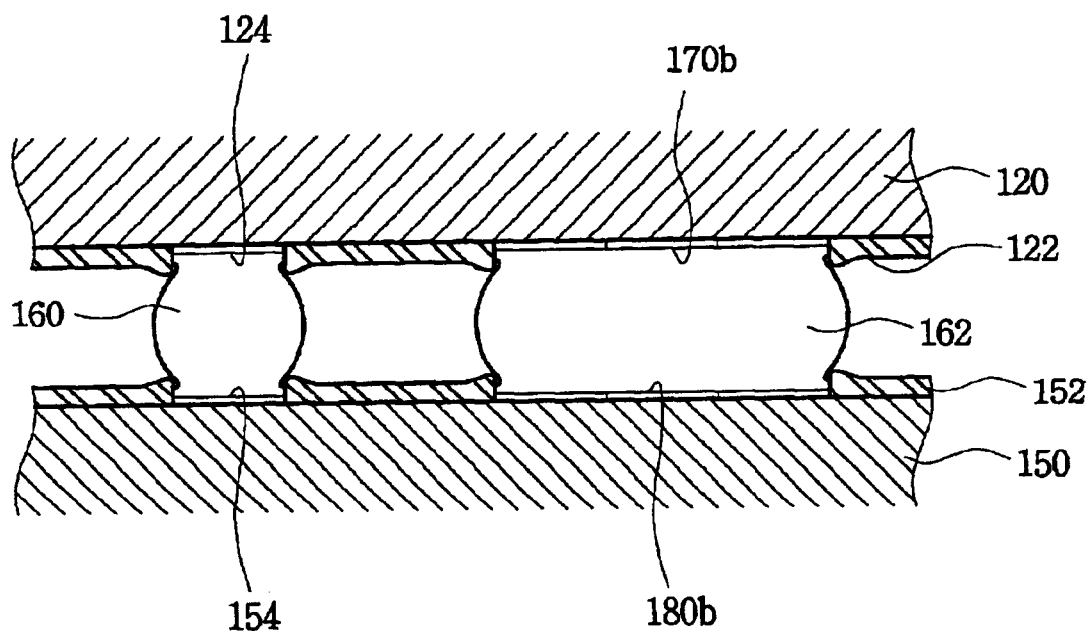

Next, referring to FIG. 8c, the solder balls 160 are formed on the ball pads 124 and the dummy pads 174 of the substrate 120. Referring to FIG. 8d, the substrate 120 is formed on the board 150 by the solder balls 160, 162 and the solder paste 164 by a solder reflow process. According to this method, the connection terminal 162 is formed over an entire area of the second enhanced pad 170b including the ball pad 124, the dummy pad 174, and the dummy pattern 172.

Since a single connection terminal is formed using the whole area of the enhanced pad (including the ball pad, the dummy pads, and the dummy patterns), this preferred method of the present invention effectively improves the reliability of the solder joint. Moreover, in this embodiment, most of the dummy patterns are arranged parallel to the long side of the substrate, along which cracks mainly occur, thereby more effectively preventing cracks. Thus, the foregoing embodiments of the present invention improve the reliability of the package mounting.

Although the present invention has been described in terms of preferred embodiments thereof, variations and modifications to the inventive concepts herein will be apparent to those skilled in the art. All such modifications fall within the spirit and scope of the present invention as defined in the appended claims.

What is claimed is:

1. A substrate for forming a ball grid array (BGA) package, comprising:
   a substrate having a top surface and a bottom surface, the bottom surface having ball pads; and
   a plurality of enhanced pads formed on the bottom surface, each enhanced pad having one or more dummy pads coupled to one or more dummy patterns,
   wherein said enhanced pads comprise a first enhanced pad, and wherein the first enhanced pad comprises a ball pad, a plurality of dummy pads, and a plurality of dummy patterns configured to connect said ball pad to said dummy pads.

2. The substrate of claim 1, wherein said enhanced pads are formed near an outer edge of said substrate.

3. The substrate of claim 2, further comprising a solder ball formed on said ball pad.

4. A semiconductor chip package comprising:
   a substrate having a top surface and a bottom surface, the bottom surface having ball pads;
   a plurality of enhanced pads formed on the bottom surface, each enhanced pad having one or more dummy pads coupled to one or more dummy patterns;
   a semiconductor chip mounted on and electrically connected to the top surface of the substrates,
   wherein said enhanced pads comprise a ball pad, a plurality of dummy pads, and a plurality of dummy patterns configured to connect said ball pad to said dummy pads.

5. The semiconductor chip package according to claim 4, wherein said enhanced pads are formed near an outer edge of said substrate.

6. The semiconductor chip package according to claim 4, further comprising a molding resin for encapsulating said semiconductor chip.

7. The semiconductor chip package according to claim 4, further comprising solder balls formed on said ball pads.

8. The semiconductor chip package according to claim 1, wherein said ball pads are arranged in a substantially lattice shape on the bottom surface of the substrate.

9. The semiconductor chip package according to claim 1, wherein the first enhanced pad comprises two dummy pads and two dummy patterns.

10. The semiconductor chip package according to claim 9, said two dummy pads are arranged perpendicular to each other.

11. The semiconductor chip package according to claim 1, wherein said enhanced pads comprise a second enhanced pad, and wherein the second enhanced pad comprises a ball pad, a dummy pad, and a dummy pattern connecting said ball pad to said dummy pad.

12. The semiconductor chip package according to claim 1, wherein said enhanced pads comprise a third enhanced pad, and wherein the third enhanced pad comprises a plurality of dummy pads and a dummy pattern for connecting said dummy pads to each other.

13. The semiconductor chip package according to claim 1, further comprising a board, said board comprising enhanced lands corresponding to said enhanced pads and ball lands corresponding to said ball pads, wherein said semiconductor chip package is mounted on said board.

14. The semiconductor chip package according to claim 13, wherein said semiconductor chip package is mounted on said board by attaching said solder balls formed on said ball pads and said dummy pads of said package to a solder paste coated on said ball lands and said enhanced lands of said board.

15. The semiconductor chip package according to claim 14 wherein said solder paste is uniformly formed on said solder balls and said dummy patterns of the enhanced pads by a solder reflow process.

16. The semiconductor chip package according to claim 1, wherein said solder balls are all approximately the same size.

17. The semiconductor chip package according to claim 1, wherein a majority of said dummy patterns are arranged parallel to a long side of said substrate.

18. A method of forming a substrate for a BGA package, comprising:
   arranging ball pads on a bottom surface of the substrate;
   arranging a plurality of enhanced pads on the bottom surface of the substrate, said enhanced pads comprising at least one dummy pad coupled to at least one dummy pattern,
   wherein said enhanced pads comprise a ball pad, a plurality of dummy pads, and a plurality of dummy patterns configured to connect said ball pad to said dummy pads.

19. The method according to claim 18, wherein arranging said enhanced pads further comprises arranging said enhanced pads near sides of the substrate.

20. The method according to claim 18, further comprising arranging a majority of the dummy patterns parallel to a long side of the substrate.

21. The method according to claim 18, wherein one or more of said enhanced pads comprise a plurality of dummy patterns.

22. The method of attaching a semiconductor package to a board, comprising:
- preparing a board by exposing ball lands and enhanced lands from a photo solder resist (PSR) layer;
- applying a mask, having openings corresponding to the ball lands and the enhanced lands, to the board;
- applying a solder paste on the ball lands and the enhanced lands;
- removing the mask;
- attaching solder balls to ball pads and enhanced pads of a substrate; and
- attaching the substrate to the board with the solder balls and the solder paste using a solder reflow process,
- wherein each of said enhanced pads comprises one or more dummy pads coupled to one or more dummy patterns.

23. A method according to claim 22, wherein an external connection terminal is formed over an entire area of the enhanced pad.

24. A method according to claim 22, wherein each of said ball lands corresponds to one of the ball pads and wherein each of the enhanced lands corresponds to one of the enhanced pads.

25. A semiconductor chip package comprising:
- a substrate having a top surface and a bottom surface, the bottom surface having ball pads;
- a plurality of enhanced pads formed on the bottom surface; and
- a semiconductor chip mounted on and electrically connected to the top surface of the substrate,
- wherein said enhanced pads comprise a ball pad, a dummy pad, and a dummy pattern configured to connect said ball pad to said dummy pad.

26. A method of forming a substrate for a BGA package, comprising:
- arranging ball pads on a bottom surface of the substrate;
- arranging a plurality of enhanced pads on the bottom surface of the substrate, said enhanced pads comprising a ball pad, a dummy pad, and a dummy pattern configured to connect said ball pad to said dummy pad.

* * * * *

UNITED STATES PATENT AND TRADEMARK OFFICE
CERTIFICATE OF CORRECTION

PATENT NO.    : 6,736,306 B2
DATED         : May 18, 2004
INVENTOR(S)   : Byun et al.

It is certified that error appears in the above-identified patent and that said Letters Patent is hereby corrected as shown below:

Column 5,
Line 63, "of the substrates, wherein" should read -- of the substrate, wherein --;

Signed and Sealed this

Eighteenth Day of January, 2005

JON W. DUDAS
*Director of the United States Patent and Trademark Office*